US011487919B2

(12) United States Patent
Mueller Fischer et al.

(10) Patent No.: US 11,487,919 B2
(45) Date of Patent: Nov. 1, 2022

(54) SIMULATING A CABLE DRIVEN SYSTEM REPRESENTATIVE OF A ROBOT

(71) Applicant: Nvidia Corporation, Santa Clara, CA (US)

(72) Inventors: Matthias Mueller Fischer, Santa Clara, CA (US); Stefan Jeschke, Santa Clara, CA (US); Miles Macklin, Santa Clara, CA (US); Nuttapong Chentanez, Santa Clara, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 17/349,347

(22) Filed: Jun. 16, 2021

(65) Prior Publication Data

US 2021/0312109 A1    Oct. 7, 2021

Related U.S. Application Data

(63) Continuation of application No. 16/152,195, filed on Oct. 4, 2018, now Pat. No. 11,068,626.

(51) Int. Cl.
*G06F 30/20* (2020.01)
(52) U.S. Cl.
CPC .................................. *G06F 30/20* (2020.01)
(58) Field of Classification Search
None
See application file for complete search history.

(56) References Cited

U.S. PATENT DOCUMENTS

| 4,932,806 A | 6/1990 | Eklund et al. |
| 7,367,245 B2 | 5/2008 | Okazaki et al. |
| 8,920,251 B2 | 12/2014 | Dietz et al. |

(Continued)

FOREIGN PATENT DOCUMENTS

| CN | 102810209 A | 12/2012 |
| CN | 104477420 A | 4/2015 |

(Continued)

OTHER PUBLICATIONS

Ham, S-H, et al., "Simulation of Load Lifting with Equalizers Used in Shipyards," Automation in Construction, Elsevier, Nov. 11, 2015, pp. 98-111, Seoul, Republic of Korea.

(Continued)

*Primary Examiner* — Steven M Christopher

(57) ABSTRACT

A cable driving a large system such as cable driven machines, cable cars or tendons in a human or robot is typically modeled as a large number of small segments that are connected via joints. The two main difficulties with this model are satisfying the inextensibility constraint and handling the typically large mass ratio between the segments and the objects they connect. This disclosure introduces an effective approach to solving these problems. The introduced approach simulates the effect of a cable using a new type of distance constraint called 'cable joint' that changes both its attachment points and its rest length dynamically. The introduced approach models a cable connecting a series of objects, e.g., components of a robot, as a sequence of cable joints, reducing the complexity of the simulation from the order of the number of segments in the cable to the number of connected objects.

20 Claims, 12 Drawing Sheets

(56) References Cited

U.S. PATENT DOCUMENTS

| | | | | |
|---|---|---|---|---|
| 2007/0171199 A1* | 7/2007 | Gosselin | ................ | G06F 3/016 |
| | | | | 345/156 |
| 2009/0265145 A1* | 10/2009 | Demizu | ................ | G06F 30/15 |
| | | | | 703/1 |
| 2014/0172380 A1* | 6/2014 | Muller-Fischer | ....... | G06F 30/23 |
| | | | | 703/2 |
| 2017/0124230 A1* | 5/2017 | Liu | ........................ | G06F 17/16 |
| 2019/0108300 A1* | 4/2019 | Soler Arasanz | ........ | G06F 30/00 |

FOREIGN PATENT DOCUMENTS

| | | |
|---|---|---|
| CN | 104298849 B | 5/2017 |
| CN | 106777736 A | 5/2017 |
| CN | 107875631 A | 4/2018 |
| WO | 2016134842 A1 | 9/2016 |

OTHER PUBLICATIONS

Huang, Q., et al. "Multi-body Dynamics Co-Stimulation of Hoisting Wire Rope," J Strain Analysis, vol. 53, pp. 36-45, Northwestern Polytechnical University, Xi'an, China.

\* cited by examiner

SIMULATING A CABLE DRIVEN SYSTEM REPRESENTATIVE OF A ROBOT

CROSS-REFERENCE TO RELATED APPLICATION

This application is a continuation application of U.S. patent application Ser. No. 16/152,195, filed by Matthias Mueller-Fischer, et al. on Oct. 4, 2018, entitled "SIMULATING A CABLE DRIVEN SYSTEM BY SIMULATING THE EFFECT OF CABLE PORTIONS ON OBJECTS OF THE SYSTEM," which is commonly assigned with this application and incorporated herein by reference.

TECHNICAL FIELD

This application is directed, in general, to a simulation of rigid body dynamics and, more specifically, to a virtual/computer simulation of cable-driven systems.

BACKGROUND

Using a computer to robustly and efficiently simulate cables and ropes that are part of a larger system such as cable driven machines, cable cars or tendons in a human or robot is a challenging task. To adapt to the environment, cables are typically modeled as a large number of small segments that are connected via joints. The two main difficulties with this approach are satisfying the inextensibility constraint and handling a large mass ratio between small segments and larger objects they connect.

SUMMARY

One aspect of the disclosure provides a method of simulating movement performed by a robot. The method includes: simulating a cable-driven system representative of a robot and having a sequence of cable joints between components of the robot, wherein at least one of the cable joints is modelled as attachment points and an upper length limit of a first cable portion, the attachment points being points in adjacent components of the robot that are adjustably attached to the first cable portion at a beginning of a time period, the upper length limit being a distance limit between the attachment points at the beginning of the time period. Simulating the cable driven-system includes: moving, based on a movement of the adjacent components over the time period, the attachment points to tangent points where the first cable portion is tangentially attached to the components at an end of the time period; and updating, based on the movement of the adjacent components over the time period, the upper length limit of the first cable portion at the end of the time period simulating a cable-driven system.

Another aspect of the disclosure provides a rigid body simulation system. The rigid body simulation system includes a processor that performs a simulation of a cable-driven system representative of a robot and having a sequence of cable joints between components of the robot, wherein at least one of the cable joints is modelled as attachment points and an upper length limit of a first cable portion, the attachment points being points in adjacent components of the robot that are adjustably attached to the first cable portion at a beginning of a time period, the upper length limit being a distance limit between the attachment points at the beginning of the time period. The simulation includes moving, based on a movement of the adjacent components over the time period, the attachment points to tangent points where the first cable portion is tangentially attached to the components at an end of the time period; and updating, based on the movement of the adjacent components over the time period, the upper length limit of the first cable portion at the end of the time period.

BRIEF DESCRIPTION

Reference is now made to the following descriptions taken in conjunction with the accompanying drawings, in which.

DETAILED DESCRIPTION

Figure 1:
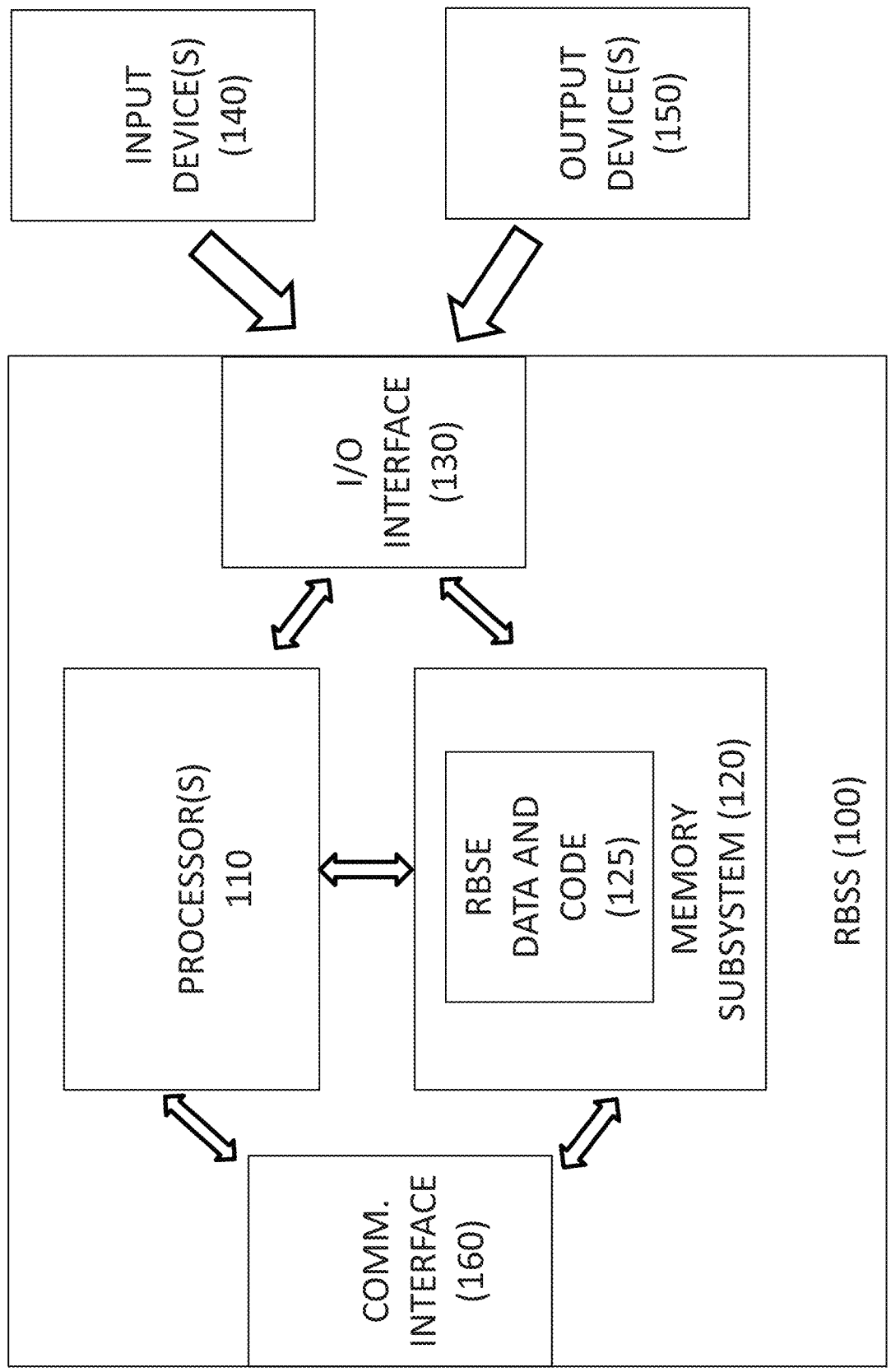
FIG. 1 is a block diagram illustrating an embodiment of a rigid body simulation system implemented according to one or more aspects of the disclosure.

Dynamic systems that are driven by cables or ropes are cable-driven systems. Cable-driven systems include cranes, pullies, cable cars, workout cable machines, bows, and even six degree-of-freedom (DOF) seats that are used in virtual reality (VR) applications. Humans and animals can also be considered as cable driven systems, where a net of tendons are the "cables"; this has implications for animations of humans and animals, but also for real-world applications, as in robotics to make robots more human-like and flexible.

Using a computer to simulate a cable in such a dynamic system is a challenging task. For a simulation, a cable has to be discretized, most commonly into a sequence of small segments, so that they can wrap correctly around objects and to resolve collisions accurately. A cable is typically modeled as one dimensional structure, and in such a structure, the connectivity is much smaller than in cloth or soft bodies. As a consequence, enforcing inextensibility—a crucial constraint for a cable—can get expensive as the number of segments becomes high.

Iterative Gauss-Seidel or Jacobi type solvers are popular due to their simplicity and compatibility with GPUs. However, in these solvers, errors propagate only one segment per iteration and prevent the simulation of long inextensible cables in real time. Another challenge for the solvers is to handle constraints between objects with large mass ratios, e.g., between small cable segments and large objects they drive.

Introduced herein is a new approach for simulating a cable-driven system. The introduced approach provides a novel simulation method that is much more robust and yet much simpler and faster than existing methods. Unlike the popular methods that simulate each and every segment of a cable, the introduced approach groups segments of a cable that actually drive the system into cable portions and simulate them as such. Understanding that the force driving the cable-driven system is exerted by the cable's resistance to stretching between the connected objects, the introduced approach defines and simulates a cable-driven system using only portions of a cable that directly connect the objects of the system. While the introduced approach mainly discusses stretching resistance, it can simulate additional forces due to compression, mass, twist or bending of cable segments as well.

Consider, for example, trying to simulate how a bicycle chain drives a bicycle. Instead of simulating each chain link individually, the introduced approach simulates only some of the chain links that directly connect the front gear and the rear gear. The introduced method simulates those chain links as two different groups, one for the links atop of the gears and the other at the bottom of the gears. As such, when the movement of a bicycle is simulated, only those two groups of the chain links are simulated and their effect on the gears that they connect is provided as a result.

In the current disclosure, each portion of a cable, e.g., each group of chain links in the bicycle example, that directly connect two objects of a cable system is simulated as a single conceptual unit called 'cable joint.' Cable joint is a special type of distance constraint that is capable of changing both its attachment points and its upper length limit dynamically. All cable joints connect two adjacent objects, and they as a whole create the effect of a single cable connecting multiple objects automatically. Thus, when modelled as a sequence of cable joints, the introduced approach can reduce the complexity of the simulation from the order of the number of segments in a system, as in the popular methods, to the number of connected objects. This also allows the simulation to be both faster and more robust, as demonstrated below. Moreover, since a cable is represented simply by its effect on connecting objects via a set of attachment points, it can be added easily to any existing rigid body simulation engine.

It is understood that simulating portions of a cable that actually exert force on the system is sufficient to emulate most cable-driven systems because the cable is typically much lighter than objects it connects and does not exert any force unless it is fully stretched. It is also understood that, in addition to cables, the introduced approach can apply to chains and ropes as well. For the current disclosure, the term cable thus refers not only to cables but also to chains, ropes and any other inextensible means that may be used to connect objects.

The introduced approach is based on two assumptions: 1) cables do not slide/slip on rotating objects; and 2) cables move in a plane which is perpendicular to the axis of rotation. The first assumption can be justified by the observation that cable-driven systems are typically designed to prevent sliding/slipping because slipping wears out cables quickly. Also slipping is only possible if there is significant friction against the rotation of the circular objects causing forces on the circumference that surpass the static friction limit. It would still be possible to model dynamic friction by maintaining a non-slip condition while adjusting the rotational friction of the circular objects accordingly. For example, a cable slipping over a static circular object could be modeled by a cable sticking to a dynamic circular object with the rotational friction.

The second assumption is natural because cables that run at an angle over a rotating circular object or cylinder fall off immediately even without any slipping (pure rolling). No system has been encountered in which this assumption does not hold. In two dimensions, the assumption holds trivially as the axis of rotation is orthogonal to the 2D plane.

FIG. 1 illustrates a block diagram of an embodiment of a rigid body simulation system (RBSS) 100 that simulates a cable-driven system using the aforementioned approach. The system 100 includes one or more processing units or processors 110, a memory subsystem 120, one or more input/output (I/O) interfaces 130, one or more input devices 140, one or more output devices 150 and a communication interface 160.

Although not shown, the system 100 also includes a system bus that interconnects the above components and provides inter-device communication and connection functionalities. The system bus can include a conventional bus/communication path such as a PCI Express, or HyperTransport link. In one embodiment, the above component can be interconnected using a proprietary interconnect system such as NVIDIA® NVLink™.

The system 100 may be embodied as a computing device, such as a personal computer (PC), a workstation, a minicomputer, a laptop, a notebook, a netbook, a PDA, a smartphone, a consumer electronic device, a gaming console, or the like. The system 100 may also be embodied as a mainframe, a cluster or farm of computing devices in a server, or the like. In one embodiment, the system 100 may be a collection of hardware elements in a rack of a data center.

The one or more processors 110 can include hardware and/or software elements configured for executing logic or program code or for providing application-specific and/or graphics-specific functionalities. Some examples of one or more the processors 110 can include one or more CPUs, one or more GPUs, one or more vector or parallel processing units, one or more microprocessors (e.g., single core and multi-core) or micro-controllers, one or more field-gate programmable arrays (FPGAs), application-specific integrated circuits (ASICs), or other microcontrollers. The one or more processors 110 may be user programmable, and include hardware elements for encoding/decoding specific types of data (e.g., video data) or for accelerating 2D or 3D drawing operations, texturing operations, shading operations, or the like. The one or more processors 110 may include any number of registers, logic units, arithmetic units, caches, memory interfaces, or the like. The one or more processors 110 may further be integrated, irremovably or moveably, into one or more motherboards or daughter boards that include dedicated video memories, frame buffers, or the like.

The memory subsystem 120 can include hardware and/or software elements configured for storing information. The memory subsystem 120 may store information using machine-readable articles, information storage devices, or computer-readable storage media. Some examples of these articles include random access memories (RAM), read-only-memories (ROMS), volatile memories, non-volatile memories, and other semiconductor memories.

In the illustrated embodiment, the memory subsystem 120 includes a non-transitory computer readable medium that stores rigid body simulation engine (RBSE) data and code 125 thereon. When executed by at least one processor, such as one or more of the processors 110, the RBSE data and code 125 causes the processors to perform RBSE operations. The RBSE operations mainly include defining a cable-driven system as a plurality of cable portions between objects in the system, i.e., cable joints, and simulating the effect of the cable portions on the connected objects. Each of the cable joints is defined as attachment points where a cable portion is adjustably attached to objects of the system and an upper length limit of the cable portion. When simulated, both the attachment points and the upper length limit are dynamically adjusted in response to the movement of the attached objects.

The one or more input/output (I/O) interfaces 130 can include hardware and/or software elements configured for performing I/O operations. One or more input devices 140 and/or one or more output devices 150 may be communicatively coupled to the one or more I/O interfaces 130. The one or more input devices 140 can include hardware and/or software elements configured for receiving information from one or more sources for computer system 100. Some examples of the one or more input devices 140 may include a computer mouse, a trackball, a track pad, a joystick, a wireless remote, a drawing tablet, a voice command system, an eye tracking system, external storage systems, a monitor appropriately configured as a touch screen, a communications interface appropriately configured as a transceiver, or the like.

The one or more output devices 150 can include hardware and/or software elements configured for outputting information to one or more destinations for the system 100. Some examples of the one or more output devices 455 can include a printer, a fax, a feedback device for a mouse or joystick, external storage systems, a monitor or other display device, a communications interface appropriately configured as a transceiver, or the like.

The communication interface 160 can include hardware and/or software elements configured for performing communications operations, including sending and receiving data. Some examples of those hardware and/or software elements include a network communications interface, an external bus interface, an Ethernet card, a modem (telephone, satellite, cable, ISDN), (asynchronous) digital subscriber line (DSL) unit, FireWire interface, USB interface, or the like. The communication operations may be conducted over a network, such as a local area network or the Internet, using one or more communications protocols, such as the HTTP, TCP/IP, RTP/RTSP protocols, or the like. Other communications software and/or transfer protocols such as IPX, UDP or the like, can also be used for communicating with hosts over the network.

Figure 2:
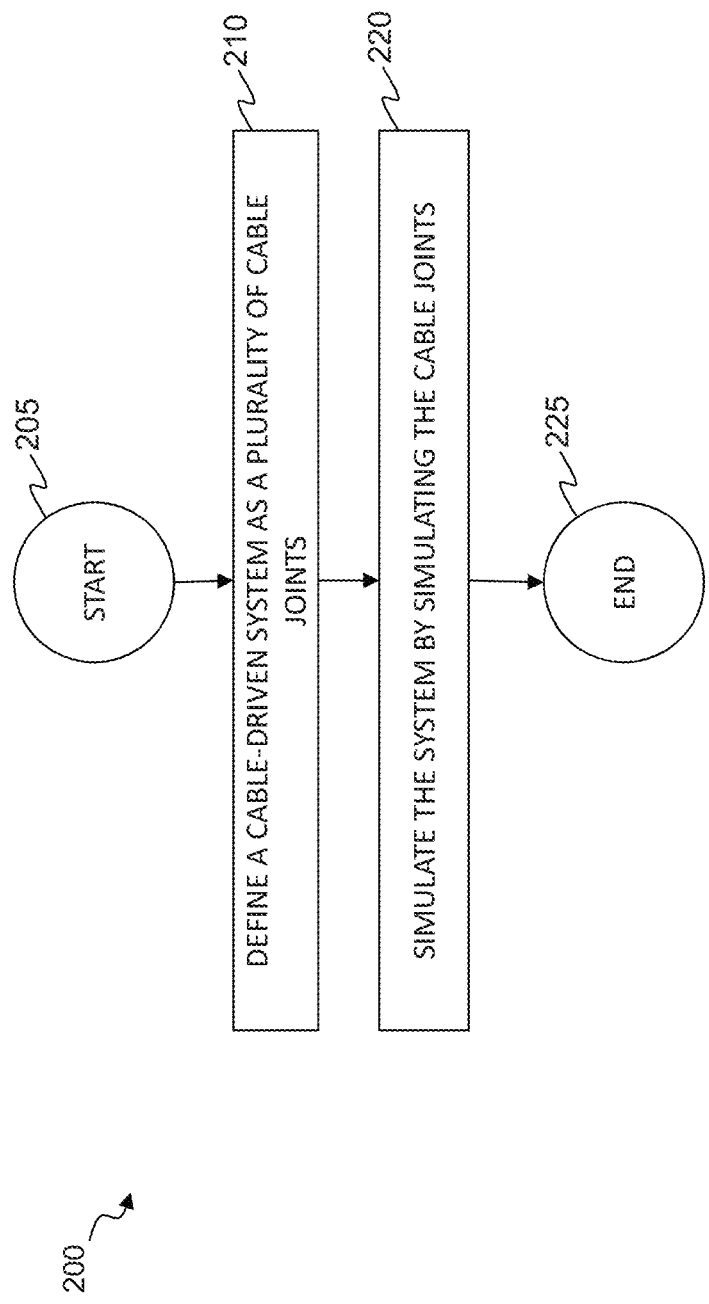
FIG. 2 is a flow diagram of an embodiment of a method implemented according to one or more aspect of the disclosure.

FIG. 2 illustrates a flow diagram of an embodiment of a method 200 for simulating a cable-driven system. Instead of simulating a cable, the method 200 simulates the effects of the cable on the objects it connects. The method 200 may be performed by a rigid body simulation system such as the RBSS 100 in FIG. 1. The method 200 starts at step 205.

At step 210, a cable-driven system is defined as a plurality of cable joints. Each cable joint represents a unilateral distance constraint between a pair of objects and is defined as two attachment points and an upper distance limit. The attachment points are points in the objects where a cable portion is adjustably attached to and the upper distance limit is the upper length limit of the cable portion between the attachment points. The objects may be shaped as a wheel/circle or other general polygon. While an attachment point of a circular object may lie anywhere in the circumference of the object, an attachment point of a polygonal shaped object coincides with a vertex of the convex hull of the object.

The step 210 includes selecting a type of link for each attachment point. A link represents a relationship between a cable portion and an object to which the cable portion connects. Types of link may include a rolling link, a pinhole link, an attachment link and a rolling-attachment link, i.e., a hybrid link.

Figure 3:
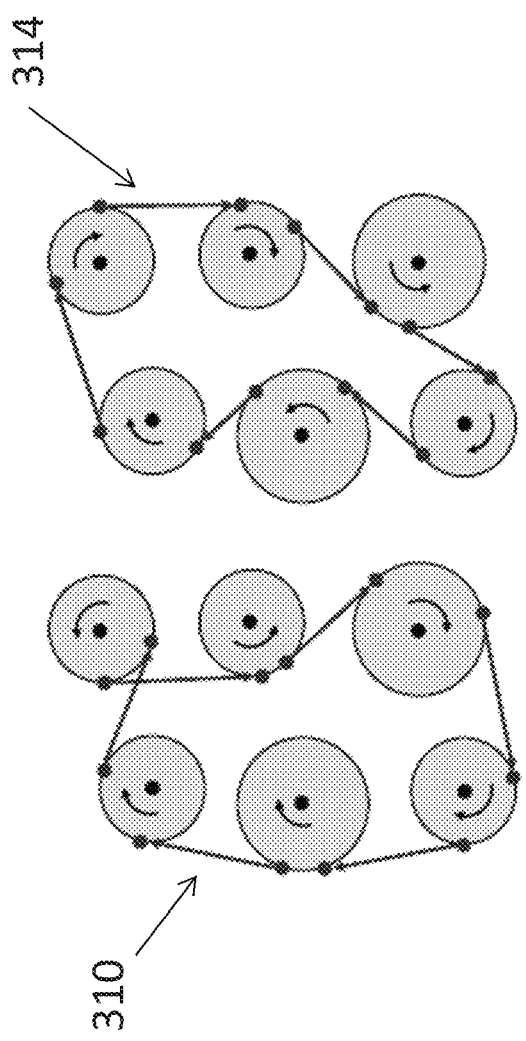
FIGS. 3A and 3B are illustrations of cable paths between objects implemented according to one or more of aspects of the disclosure.

The step 210 also includes defining the objects' orientations, e.g., a direction of rotation, and order, e.g., a sequence of cable joints. FIG. 3A and FIG. 3B illustrate two different complete cable paths 310 and 314 in which the orientations and the order of the objects along the cable paths 310 and 314 have been defined. It is understood that the orientation does not restrict the direction of rotation during the simulation. In one embodiment, the step 210 also includes choosing whether the cable is open or closed. It is understood that since the cable that drives the system is represented simply by a set of cable joints, the modeled system can be added to most conventional rigid body engines.

Figure 4:
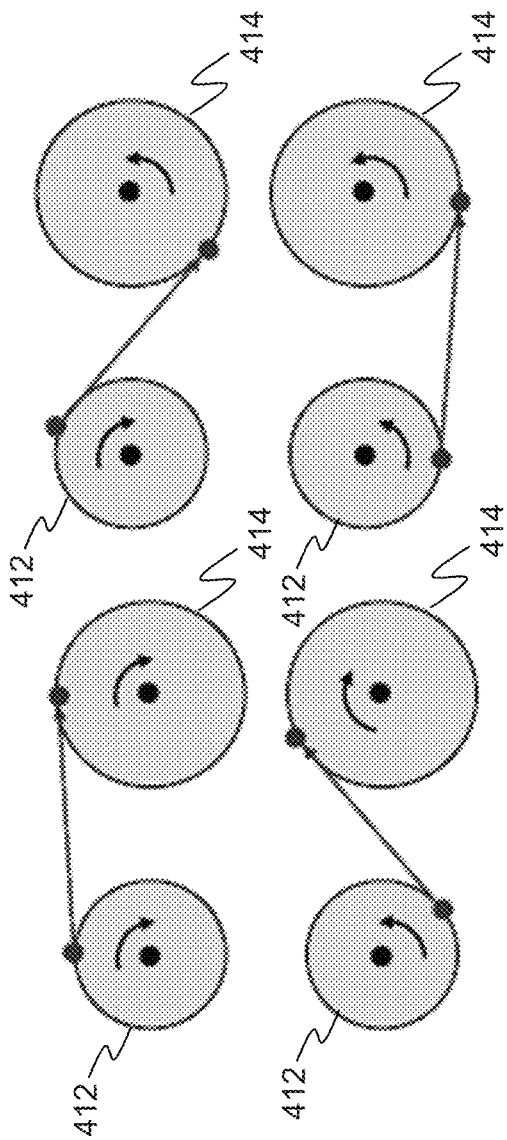
FIG. 4 is an illustration of possible common tangents between circular objects.

Once the orientations and orders the objects are defined, tangents between the objects are selected. FIG. 4 illustrates four possible common tangents between two circular objects 412, 414. Selecting tangents based on the objects' orientations and order makes the tangent selection unique and ensures that the cable joints create a consistent cable. To ensure that joints behave correctly with respect to the chosen tangents, the distances the attachment point travel have to be measured in the direction defined by the orientation. Specifically, the distance is positive if the orientation of the portion on the circular object from the new to the previous attachment point corresponds to the orientation of the circular object.

Figure 5:
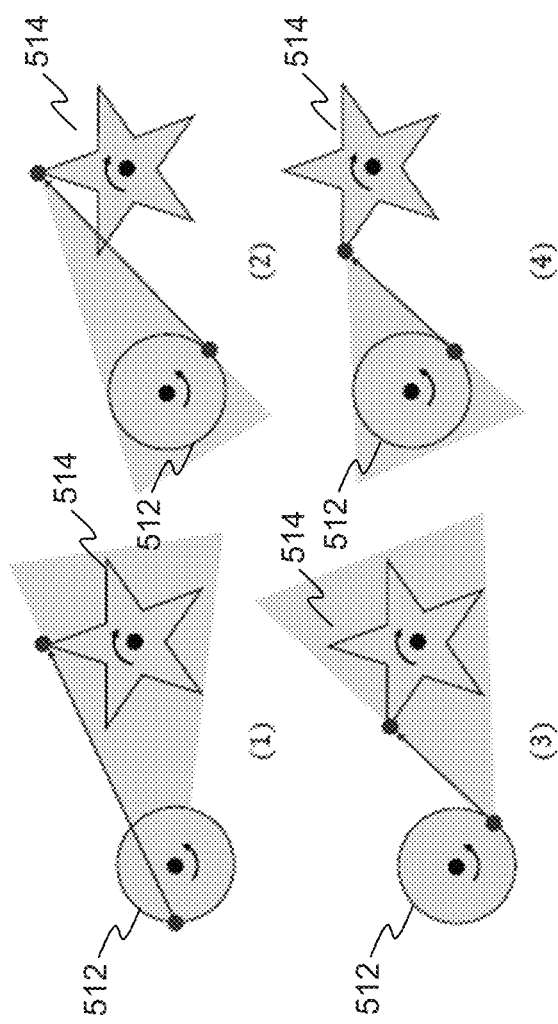
FIG. 5 is an illustration of how to compute a tangent between a circular object and a polygonal shaped object implemented according to one or more aspects of the disclosure.

FIG. 5 illustrates how a tangent between a circular object 512 and a polygonal shaped object 514 can be computed iteratively. A random point on the circular object 512 is chosen. Depending on the orientation of the shape 514, the left or rightmost point on the shape 514 is determined. From this point, the left or rightmost point on the circular object 512 is determined depending on its orientation. This process is repeated until the two points are not updated anymore. This iteration can converge quickly in practice. This iterative works for the circle-polygon and polygon-circle cases and terminates in a finite number of steps. For the simpler circle-circle case, the formula given in the Algorithm 1 may be used.

Below algorithms show pseudo codes for computing tangent points between objects based on their orientations. Algorithm 3 is for the computation between a point and a circle, e.g., a pinhole link and a rolling link, and Algorithm 4 is for the computation between two circles, e.g., two rolling links. If both links adjacent to a cable joint are non-rolling, the tangent is simply the line connecting them. Even though the cable joints do not "know" of each other and the part of the cable on the circular objects is not explicitly modeled, the correct physical behavior of a cable and how it affects the objects it connects may be simulated.

---

Algorithm 3 Tangent Point Circle

1: procedure TanagetPointCircle($p_1$, $p_2$, r)
2:     d ← $p_2 - p_1$
3:     if |d| > r then
4:        $\alpha \leftarrow \begin{cases} \arcsin(d_y/|d|) & \text{if } d_x \geq 0, \\ \pi - \arcsin(d_y/|d|) & \text{otherwise} \end{cases}$
5:        $\phi \leftarrow \arcsin(r/|d|)$
6:        $\alpha \leftarrow \begin{cases} \alpha - \pi/2 - \phi & \text{orientation positive} \\ \alpha + \pi/2 + \phi & \text{otherwise} \end{cases}$
7:        return $p_2 + r \begin{bmatrix} \cos(\alpha) \\ \sin(\alpha) \end{bmatrix}$
8:     end if
9: end procedure

---

Algorithm 4 Tangent Circle Circle

1: procedure TangentCircleCircle($p_1$, $r_1$, $p_2$, $r_2$)
2:     d ← $p_2 - p_1$
3:     $r \leftarrow \begin{cases} r2 - r1 & \text{orientations equal} \\ r1 + r2 & \text{otherwise} \end{cases}$
4:     if |d| > r then
5:        $\alpha \leftarrow \begin{cases} \arcsin(d_y/|d|) & \text{if } d_x \geq 0, \\ \pi - \arcsin(/d_y|d|) & \text{otherwise} \end{cases}$
6:
7:     if orientations equal then
8:        $\alpha_1 \leftarrow \begin{cases} \alpha - \pi/2 - \phi & \text{orientation 1 positive} \\ \alpha + \pi/2 + \phi & \text{otherwise} \end{cases}$
9:        $\alpha_2 \leftarrow \begin{cases} \alpha - \pi/2 - \phi & \text{orientation 2 positive} \\ \alpha + \pi/2 + \phi & \text{otherwise} \end{cases}$
10:    else
11:       $\alpha_1 \leftarrow \begin{cases} \alpha - \pi/2 + \phi & \text{orientation 1 positive} \\ \alpha + \pi/2 - \phi & \text{otherwise} \end{cases}$
12:       $\alpha_2 \leftarrow \begin{cases} \alpha - \pi/2 - \phi & \text{orientation 2 positive} \\ \alpha + \pi/2 + \phi & \text{otherwise} \end{cases}$
13:    end if
14:    return $p_1 + r_1 \begin{bmatrix} \cos(\alpha_1) \\ \sin(\alpha_1) \end{bmatrix}, p_2 + r_2 \begin{bmatrix} \cos(\alpha_2) \\ \sin(\alpha_2) \end{bmatrix}$
15:    end if
16: end procedure

---

Returning to FIG. 2, the cable-driven system is simulated in step 220. For a cable joint having a rolling link, the step 220 dynamically adjusts, in response to the movement, e.g., rotations of the connected/attached objects, the attachment points of the cable joint to a tangent point, where the cable portion, e.g., a plane or length thereof, remains tangent to the objects. Simultaneously, the step 220 also dynamically determines the distances and directions the attachment points have traveled along the surfaces of the connected objects to reach the tangent points and updates the upper length limit of the cable joint to absorb the distances. This basic algorithm that can be employed is summarized below as Algorithm 1:

---

Algorithm 1 Basic Algorithm

1: procedure TimeStep
2:    for all cable joints do
3:       compute new attachments points $a'_l$ and $a'_r$
         ▷ see Alg. 3 or 4
4:       $\bar{d} \leftarrow \bar{d} + \text{surfaceDist}(a_l, a'_l)$
5:       $\bar{d} \leftarrow \bar{d} - \leftarrow \text{surfaceDist}(a_r, a'_r)$
6:       $a_l \leftarrow a'_l, a_r \leftarrow a'_r$
7:    end for
8:    for all cable joints do $\hat{d} \leftarrow \bar{d}$
9:    for all pinhole links do
10:      if dl > $\hat{d}_l$ then
11:        $\bar{d}_l \leftarrow \bar{d}_l + (d_l - \hat{d}_l), \bar{d}_r \leftarrow \bar{d}_r - (d_l - \hat{d}_l)$
12:      end if
13:      if $d_r > \hat{d}_r$ then
14:        $\bar{d}_l \leftarrow \bar{d}_l - (d_r - \hat{d}_r), \bar{d}_r \leftarrow \bar{d}_r + (d_r - \hat{d}_r)$
15:      end if
16:    end for
17:    runSolvent (☐)
         ▷ treat all cable joints as unilateral distance joints
18: end procedure

---

Figure 6:
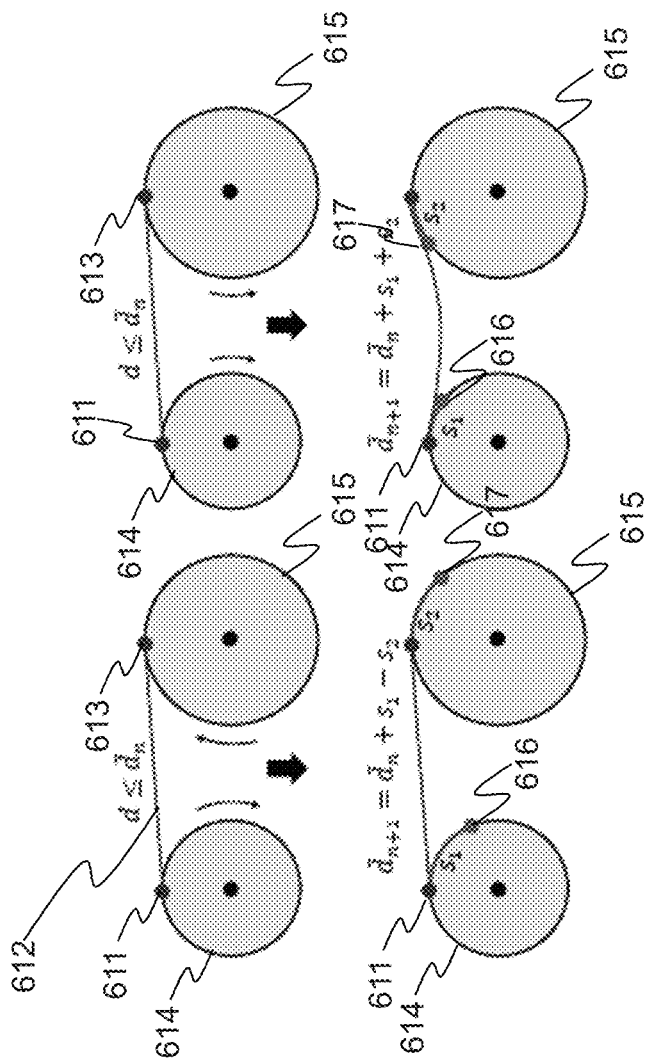
FIG. 6 is an illustration of a simulation of an embodiment of a rolling link between two circular objects implemented according to one or more aspects of the disclosure.
Figure 7:
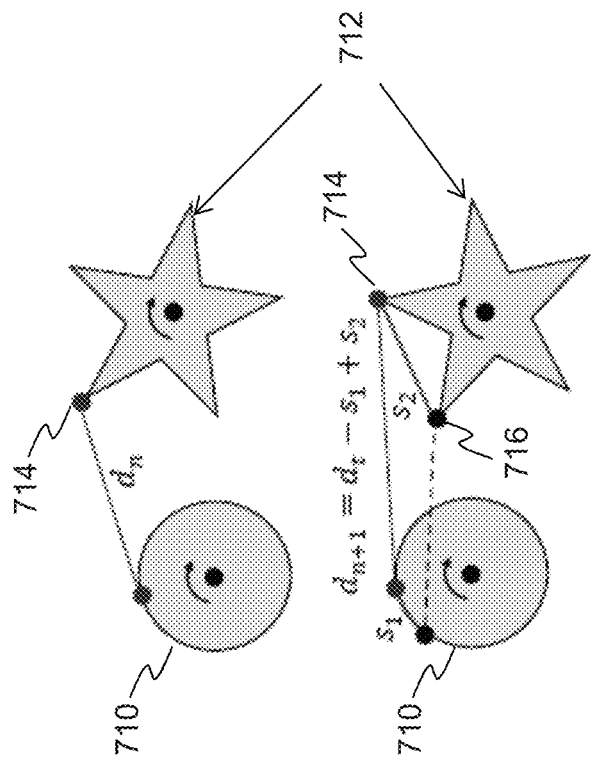
FIG. 7 is an illustration of a simulation of an embodiment of a rolling link between a circular object and a polygonal shaped object implemented according to one or more aspects of the disclosure.

FIG. 6 and FIG. 7 illustrate simulations of rolling links. FIG. 6 illustrates a simulation of a rolling link between two circular objects. A cable joint 610 is simulated as a unilateral distance constraint between two attachment points 611 and 613 on two circular objects 614 and 615. The simulation enforces d≤$\bar{d}$n, where d is the distance between the attachment points at a given time step and $\bar{d}$n is the upper distance limit at the current time step n. The upper distance constraint is unilateral because it is assumed that the cable does not support endpoint to endpoint compression or at least that the system the cable is part of does not rely on compression support. This is the case for most cable-driven systems. This assumption can be dropped by using a bilateral constraint with a controllable stiffness in the compressed state.

With fixed attachment points, the attachment points would be at the locations, 616, 617, after one time step (n+1), as shown in the bottom row of FIG. 6. But with dynamic attachment points, the cable joint 610 adjusts its attachment points 611, 613 such that the cable portion 612 remains tangent to the two objects 614, 615. Distances s1 and s2 indicate the distances the attachment points 611, 613 have moved along the surface of the objects 614, 615.

After updating the attachment points, the upper distance limit (or upper length limit) of the joint 610 is adjusted to compensate for the distances the attachment points 611, 613, have travelled along the surface of the objects 614, 615. In the cable joints on the bottom left side, these distances correspond to the amount of cable that was unwound from the left object 614 and wound up by the right object 615, respectively. Therefore, s1 has to be added and s2 subtracted from the upper length limit. On the bottom right side, the cable was unwound from both circular objects so both s1 and s2 have to be added to the upper length limit.

In the illustrated embodiment, the cable portion 612 can only exert forces on the objects in the stretched state. This is the reason why cable joints adjust their attachment points dynamically to remain tangent. Apart from the adjustment of the attachment point's locations, the cable portion 612 is modeled as a regular distance constraint between the objects 614, 615. The change of the attachment locations has to be compensated by adjusting the cable joint's upper length limit in order to get the correct behavior of the cable.

In the illustrated embodiment, both the stretched and the loose case of the cable portion are modeled. In the stretched case where d=d̄, the cable joint is tangent to the circular objects 614, 615, and it exerts forces. In the loose state, where d is smaller than the upper length limit d̄, the points at which the cable portion leaves the circular objects 614, 615, are not the tangent points. It would be difficult to compute the true locations. Fortunately, because no forces are exerted in the loose state, the error introduced by keeping the constraint tangent has no effect on the simulation. While the loose case is visualized by drawing a curved cable procedurally but for the simulation it may be considered as a straight line. If the circular objects 614, 615, at the bottom right of FIG. 6 make a full turn in the direction shown, the circumference of both circular objects would be added to the upper length limit d̄. When the circular objects 614, 615, switch the rotation direction, no force acts up until they do a full turn back at which point the cable joint correctly kicks in again.

FIG. 7 illustrates a simulation of a rolling link between a circular object 710 and a polygonal shaped object 712. On a mesh-based shape object such as object 712, the attachment point 716 always coincides with a vertex 714 of the convex hull because the cable on the object takes the shape of the convex hull. The distance on the surface or the amount of cable that is added or removed has to be measured along the convex hull as well. Since the objects both rotate opposite to their orientation in this particular case, the signs of s1 and s2 in the formula on FIG. 7 are opposite to the signs in FIG. 6.

Figure 8:
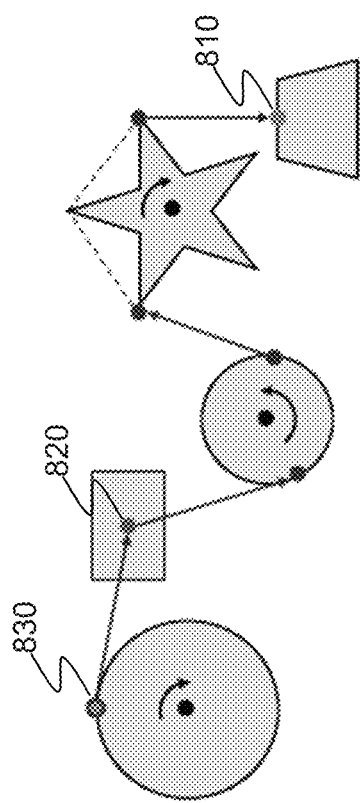
FIG. 8 is an illustration of an embodiment of links implemented according to one or more aspects of the disclosure.

FIG. 8 illustrates simulations of an attachment link 810, a pinhole link 820 and a hybrid link 830. For the attachment link 810, neither the attachment point nor the upper length limit is modified. For the pinhole link 820, as the cable slips through a hole that is fixed relative to the object, the attachment point is not moved. The upper length limits of the two adjacent cable joints, however, are adjusted such that their tensions (the current length divided by the upper length limit) are the same. This procedure is detailed in the second part of Algorithm 1.

Figure 9:
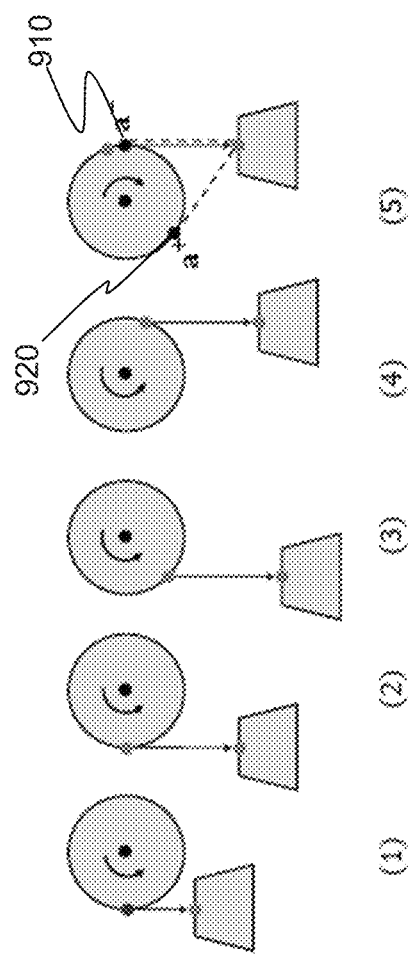
FIG. 9 is an illustration of embodiments of a hybrid link implemented according to one or more aspects of the disclosure.

A hybrid link 830 in FIG. 8 is a link that automatically switches between a rolling link and an attachment link. The hybrid link 830 requires a finite amount of cable s to be wound on the adjacent object to work. Thus, to simulate the hybrid link, this amount of cable s is initialized when the cable joint is defined and updated when the upper length limit is changed due to the motion of the attachment point. If the amount s becomes negative, the link becomes an attachment link simulating that the cable is used up. FIGS. 9(2)-(4) illustrate this situation. The hybrid link becomes a rolling link again when the fixed attachment passes one of the two possible tangents as illustrated in FIG. 9(5). Therefore, during the simulation, the rolling attachment points a+ 920 and a− 910 for hybrid attachments are constantly computed. In one embodiment, the orientation is adjusted to match the actual tangent.

Figure 10:
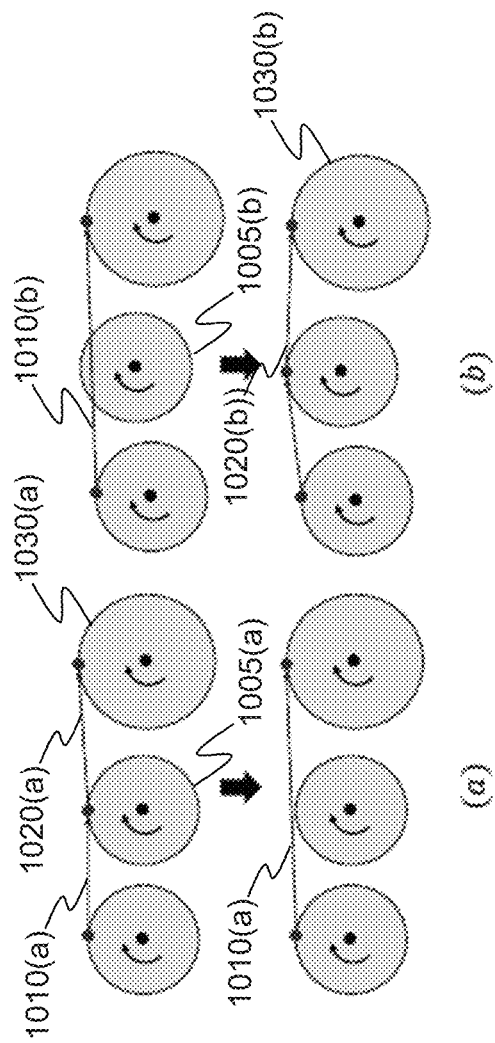
FIG. 10 is an illustration of exemplary merge and split events of a cable joint implemented according to one or more aspects of the disclosure.

Also during the step 220, the system is dynamically updated with respect to a changing environment. FIG. 10(a) illustrates a merge event wherein a cable joint is deleted. A merge event is triggered when two cable joints, a first cable joint 1010(a) and second cable joint 1020(a), are adjacent to an object 1005(a) via rolling links and the amount of cable contained on the object 1005(a) becomes negative. In this case, the second cable joint 1020(a) is removed; its upper length limit is added to the upper length limit of the first cable joint 1010(a); and the first cable joint 1010(a) is linked to the third object 1030(a). In one embodiment, instead of actually deleting it, the unnecessary link is simply marked as inactive.

Cable joints are created during a split event as shown in FIG. 10(b). A split event is triggered when the tangent of a cable joint intersects an object 1005(b). The first joint 1010(b) is redirected to the intersecting object 1005(b) and a new joint 1020(b) that connects the intersecting object 1005(b) with the second object 1030(b) of the original joint is created. The upper length limit of the original joint is distributed among the new joints such that the tensions on both sides are equal. In a split event, a cable plane for the new link needs to be determined. Such a plane could be chosen based on the location of the cable and the adjacent objects.

Pseudo code for the extended features of the method 200 such as the hybrid link and the merge and split events that require a fixed amount of the cable to be wound on an object are summarized in Algorithm 2.

| Algorithm 2 Extended Features |
|---|
| 1: for all links do |
| 2:     s ← surfaceDist ($a_l$, $a_r$) or user specified |
| 3: end for |
| 4: . . . |
| 5: procedure TimeStep |
| 6:     . . . |
| 7:     for all cable joints do |
| 8:        $s_l$ ← $s_l$ − surfaceDist ($a_l$, $a'_l$) |
| 9:        $s_r$ ← $s_r$ + surfaceDist ($a_r$, $a'_r$) |
| 10:     end for |
| 11:     for all links do |
| 12:        if s < 0 and type = hybrid rolling then |
| 13:           type ← hybrid attachment |
| 14:        else if type = hyrid attachment then |
| 15:           compute rolling attachments $a^+$ and $a^−$ |
| 16:           if surfaceDist($a^+$, a) < 0 then |
| 17:              type ← hybrid rolling positive |
| 18:           else if surfaceDist($a^+$, a) > 0 then |
| 19:              type ← hybrid rolling negative |
| 20:           end if |
| 21:        end if |
| 22:     end for |
| 23:     for all rolling links with s < 0 do |
| 24:        merge adjacent joints;set inactive |
| 25:     end for |
| 26:     for all cable joints intersection inactive link l do |
| 27:        split joint using l; set l active |
| 28:     end for |
| 29:     runSolvent( ) |
| 30: end procedure |

The step 220 is repeated for each time step of the simulation. When all the time steps are passed, the method 200 ends at step 225. It is understood that the method 200 may be used to simulate a 3D cable driven system. To handle arbitrarily positioned objects in such a system, the method 200 would additionally define a local cross section of each 3D object as a cable plane that the cable is restricted to move at the step 210. For a cylinder, the cable plane would be perpendicular to the cylinder's axis and hence is a disc-shaped. For mesh-based shapes, the cable plane would be chosen arbitrarily and its convex hull would be computed.

Figure 11:
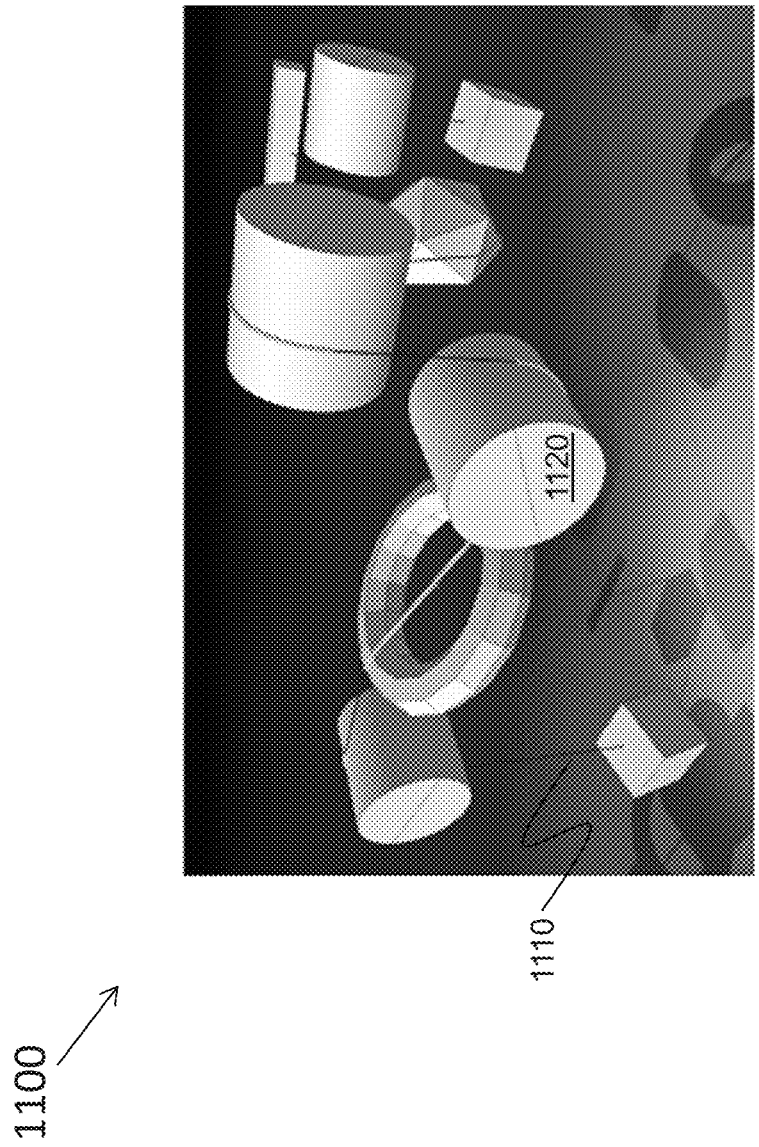
FIGS. 11 and 12 are illustrations of embodiments of a 3D cable driven system implemented according to one or more aspects of the disclosure.
Figure 12:
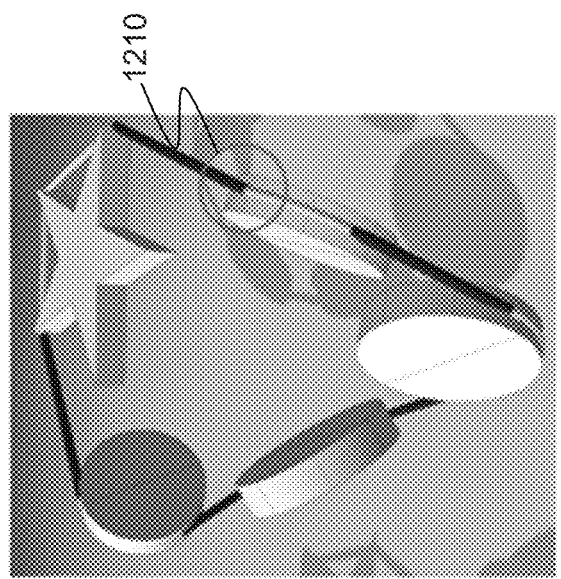

FIG. 11 illustrates an embodiment of the general case 1100 having a cable 1110 and multiple objects, such as cylinder 1120. In the illustrated embodiment, one local cross section plane per 3D object in which the cable 1110 is restricted to move is defined. For cylinders such as a cylinder 1120, the cross section is a disc since the cable plane is required to be perpendicular to the cylinder's axis. It is noted that this requirement does not restrict adjacent circular objects to be perpendicular to each other for the cable to be continuous as FIG. 12 shows. For the cable system in FIG. 12 to work, the wheels have to be indented to accommodate a transition such as 1210 that may kink temporarily. For mesh-based shapes, the cable plane can be chosen arbitrarily. As a pre-processing step, e.g., the step 210, the method 200 computes the convex hull of the cross section. In this way, the method may reduce the 3D to the 2D case.

Although the cable planes of the two objects adjacent to a cable joint may not coincide, the tangents between them can still be computed using the algorithm represented in FIG. 5. The only modification is that the attachment of one object needs to be projected onto the tangent plane of the other object (and vice versa) to get the cable in both local frames. For the frequent case of two cylinders with coinciding cable planes, the disc-disc algorithm may be used.

The above-described apparatuses, systems or methods or at least a portion thereof may be embodied in or performed by various processors, such as digital data processors or computers, including cloud computing systems and servers, wherein the processors are programmed or store executable programs or sequences of software instructions to perform one or more of the steps of the methods or functions of the apparatuses or systems. The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers, including cloud computing systems and servers, to perform one, multiple or all of the steps of one or more of the above-described methods or functions of the system described herein.

Certain embodiments disclosed herein may further relate to computer storage products with a non-transitory computer-readable medium that have program code thereon for performing various computer-implemented operations that embody at least part of the apparatuses, the systems or carry out or direct at least some of the steps of the methods set forth herein. Non-transitory medium used herein refers to all computer-readable media except for transitory, propagating signals. Examples of non-transitory computer-readable medium include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

In interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

Those skilled in the art to which this application relates will appreciate that other and further additions, deletions, substitutions and modifications may be made to the described aspects. It is also to be understood that the terminology used herein is for the purpose of describing particular aspects only, and is not intended to be limiting, since the scope of the present disclosure will be limited only by the claims. Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, a limited number of the exemplary methods and materials are described herein.

It is noted that as used herein and in the appended claims, the singular forms "a", "an", and "the" include plural referents unless the context clearly dictates otherwise.

What is claimed is:

1. A method of simulating movement performed by a robot comprising:
    simulating a cable-driven system representative of a robot and having a sequence of cable joints between components of the robot, wherein at least one of the cable joints is modelled as attachment points and an upper length limit of a first cable portion, the attachment points being points in adjacent components of the robot that are adjustably attached to the first cable portion at a beginning of a time period, the upper length limit being a distance limit between the attachment points at the beginning of the time period, wherein the simulating includes:
    moving, based on a movement of the adjacent components over the time period, the attachment points to tangent points where the first cable portion is tangentially attached to the components at an end of the time period; and
    updating, based on the movement of the adjacent components over the time period, the upper length limit of the first cable portion at the end of the time period.

2. The method of claim 1, wherein said updating includes determining distances and directions the attachment points have traveled to reach the tangent points.

3. The method of claim 1, wherein the cable-driven system is a three-dimensional cable-driven system, and said simulating further includes defining cross section planes of the adjacent components and restricting said moving to the cross section planes.

4. The method of claim 1, wherein the adjacent components include a circular component and at least one of the attachment points travels along a circumference of the circular component.

5. The method of claim 4, wherein the adjacent components include a polygonal-shaped component, at least one of the attachment points moves along a convex hull of the polygonal-shaped component, and the at least one attachment point coincides with a vertex of the convex hull.

6. The method of claim 1, wherein said simulating includes defining orientations and an order of the adjacent components, and selecting the tangent points based on the orientations and the order.

7. The method of claim 1, wherein said simulating includes selecting links for the attachment points from the group consisting of a rolling link, a pinhole link, an attachment link, and a rolling-attachment hybrid link.

8. The method of claim 1, wherein the cable-driven system is driven by cable portions connecting components of the robot, wherein the cable portions include chains and ropes.

9. The method of claim 1, wherein the first cable portion includes a group of cable segments that are between the adjacent components of the robot.

10. The method of claim 1, wherein the sequence of cable joints represents a net of tendons in the robot.

11. A rigid body simulation system, comprising:
a processor that:
performs a simulation of a cable-driven system representative of a robot and having a sequence of cable joints between components of the robot, wherein at least one of the cable joints is modelled as attachment points and an upper length limit of a first cable portion, the attachment points being points in adjacent components of the robot that are adjustably attached to the first cable portion at a beginning of a time period, the upper length limit being a distance limit between the attachment points at the beginning of the time period, wherein the simulation includes:
moving, based on a movement of the adjacent components over the time period, the attachment points to tangent points where the first cable portion is tangentially attached to the components at an end of the time period; and
updating, based on the movement of the adjacent components over the time period, the upper length limit of the first cable portion at the end of the time period.

12. The system of claim 11, wherein said updating includes determining distances and directions the attachment points have moved to reach the tangent points.

13. The system of claim 11, wherein the cable-driven system is a three-dimensional cable-driven system, and the simulation further includes defining cross section planes of the adjacent components and restricting said moving to the cross section planes.

14. The system of claim 11, wherein the adjacent components include a circular component and at least one of the attachment points travels along a circumference of the circular component.

15. The system of claim 11, wherein the adjacent components include a polygonal-shaped component, at least one of the attachment points moves along a convex hull of the polygonal-shaped component, and the at least one attachment point coincides with a vertex of the convex hull.

16. The system of claim 11, wherein the simulation includes defining orientations and an order of the adjacent components, and selecting the tangent points based on the orientations and the order.

17. The system of claim 11, wherein the simulation includes selecting links for the attachment points from the group consisting of a rolling link, a pinhole link, an attachment link, and a rolling-attachment hybrid link.

18. The system of claim 11, wherein the cable-driven system is driven by cable portions connecting components of the robot, wherein the cable portions include chains and ropes.

19. The system of claim 11, wherein the first cable portion includes a group of cable segments that are the adjacent components of the robot.

20. The system of claim 11, wherein the sequence of cable joints represents a net of tendons in the robot.

* * * * *